US006995701B1

(12) United States Patent
Churchill et al.

(10) Patent No.: US 6,995,701 B1
(45) Date of Patent: Feb. 7, 2006

(54) MULTICHANNEL HIGH RESOLUTION SEGMENTED RESISTOR STRING DIGITAL-TO-ANALOG CONVERTERS

(75) Inventors: Simon Bevan Churchill, Whitchurch (GB); Gaurang Arvind Shah, San Jose, CA (US); David Webb, Hungerford (GB); Bharath Mandyam, Sunnyvale, CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 0 days.

(21) Appl. No.: 10/791,333

(22) Filed: Mar. 2, 2004

(51) Int. Cl.
*H03M 1/66* (2006.01)

(52) U.S. Cl. ........................ 341/154; 341/144; 341/110

(58) Field of Classification Search ................ 341/143, 341/154, 144, 159, 110
See application file for complete search history.

(56) References Cited

U.S. PATENT DOCUMENTS 4,491,825 A * 1/1985 Tuthill ........................ 341/154
4,543,560 A * 9/1985 Holloway .................. 341/144
5,059,978 A * 10/1991 Valdenaire .................. 341/144
5,627,537 A * 5/1997 Quinlan et al. ............. 341/144
5,703,588 A * 12/1997 Rivoir et al. ............... 341/154
6,037,889 A 3/2000 Knee
6,191,720 B1 * 2/2001 Zhang ........................ 341/144
6,486,818 B1 * 11/2002 Nicholson et al. .......... 341/154
6,628,216 B2 * 9/2003 Chen et al. ................. 341/154

* cited by examiner

*Primary Examiner*—Lam T. Mai
(74) *Attorney, Agent, or Firm*—Blakely, Sokoloff, Taylor & Zafman LLP

(57) ABSTRACT

Multi-channel high resolution segmented resistor string digital-to-analog converters (DACs) suitable for realization in a single integrated circuit. The DACs incorporate a primary resistor string shared by all channels, and one or more additional pluralities of additional resistor strings for additional resolution. The primary resistor string may be buffered to limit the effect of loading thereon by the plurality of resistor strings coupled thereto. Current sources may also be coupled to the resistor strings coupled to the primary resistor string to also avoid loading of the primary resistor string. A trimmable resistor string of fewer bits may be connected to the primary resistor string for laser trimming. In the embodiment disclosed, a plurality of secondary and tertiary resistor strings are used, with leapfrogging minimizing the switches required.

30 Claims, 4 Drawing Sheets

MULTICHANNEL HIGH RESOLUTION SEGMENTED RESISTOR STRING DIGITAL-TO-ANALOG CONVERTERS

BACKGROUND OF THE INVENTION

1. Field of the Invention

The present invention relates to the field of digital-to-analog converters (DACs)

2. Prior Art

Designing multiple-channel (such as greater than 8), high-resolution DACs (such as greater than 14-bits) in minimum die area has always been a challenging problem in the analog world. In many level-setting and closed loop applications, multiple high-resolution DAC channels are required that need guaranteed monotonic behavior and better than 12-bits of absolute accuracy.

Normally, R-2R DACs are used for high resolution and accuracy. The resolution of an untrimmed R-2R DAC is limited to 10 to 12-bits. In order to guarantee differential nonlinearity (DNL) at greater than a 14-bit level, a significant amount of trimming is involved, which in turn adds substantial cost to the integrated circuit. Also since the input resistance looking into the DACs is relatively smaller for multi channel DACs, precision buffers are needed for the high and low references for such architecture. Precision buffers are expensive in terms of die area.

Integrating multiple channels of independent high-resolution DACs also contributes to significant die-area that adds both to the cost and the footprint of the integrated circuit. Sample and hold approaches have been proposed that cut down the die-area for a multi-channel, high resolution DAC, but this generally results in pedestal, droop and feedthrough errors owing to the sampling nature of the system.

DETAILED DESCRIPTION OF THE PREFERRED EMBODIMENTS

The present invention uses a novel architecture for multichannel DACs that achieves guaranteed monotonicity, high-channel density (M-channels of N-bit DAC) and good accuracy (integral nonlinearity, or INL) over the prior art at a significantly lower die area and trim cost. The architecture is based on 3-stage resistor string segmentation. It is comprised of an “A”-bit primary string that is shared between M lower-order DACs. Each lower order DAC comprises of “B”-bit secondary string and “C”-bit tertiary string. Low impedance buffers and replica biased bootstrapped current sources at the output of the common primary string taps allow sharing of the “A” MSB bits between all of the M DACs.

The unique architecture divides the effective resolution and accuracy into “A” MSB bits of primary and “B+C” bits of secondary DACs. The “A” bits of MSBs, being shared between pluralities of secondary DACs, reduce the die area significantly. The buffers that are needed for R-2R DACs are used as a means to buffer the primary string outputs, thereby offering low impedance reference levels that the secondary DACs interpolate between to give the final output. Hence the architecture is extremely compact and efficient for multi-channel, high resolution DACs.

Figure 1:
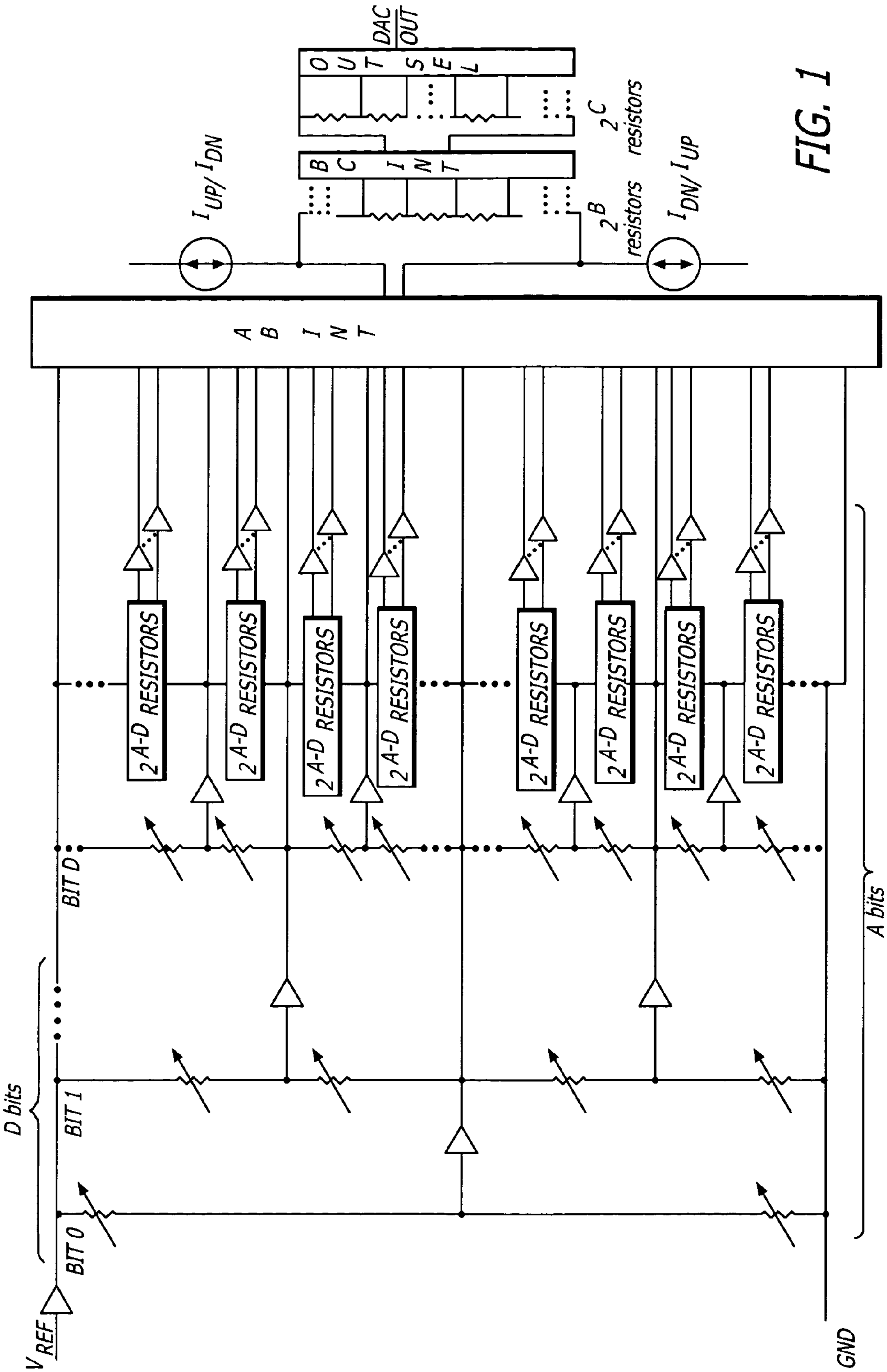
FIG. 1 is a simplified diagram illustrating the architecture of an exemplary N-bit DAC in accordance with the present invention.

FIG. 1 is a simplified diagram illustrating the architecture of an exemplary N-bit DAC in accordance with the present invention. A primary $2^A$ element resistor string implements the “A” MSBs. Each tap of the primary string is buffered, effectively splitting the reference voltage into $(2^A+1)$ low-impedance voltage levels (including $V_{REF}$ and GND) or $2^A$ voltage increments that can then be shared by the M-channel lower order DACs, where each voltage increment is equal to $V_{REF}/2^A$.

There are two sources of mismatch in the “A” MSB string, which are the chief contributors to INL. Resistor mismatch induced INL will peak at mid-code without the trimming of any of the $2^A$ resistors. In order to reduce this error and to minimize the number of trim resistors, “D” bit (where “D” is less than “A”) laser trimmed resistors are preferably placed in parallel with the primary string. The “D” bits are the most significant of the A most significant bits (MSBs). By precisely trimming the “D” bit resistors to $(½)^D$, $(½)^{(D-1)}$ . . . $(2^D-1)/(2^D)$ of the reference voltage, the INL error due to resistor mismatch is reduced by $½^{(D/2)}$ of the peak value.

The buffered outputs of the D bits are coupled to corresponding A bit output switches, and to multiple $(2^D)2^{A-D}$ resistor strings, the nodes of which are buffered and coupled to respective A bit output switches for the total of $(2^A+1)$ A bit output voltages, including the ground GND and $V_{REF}$ voltages.

Alternatively, the D bit strings may be eliminated and the A bit string trimmed, as each A bit node is buffered and thus not disturbed by loading. As a further alternative, D may equal A, in which case the D bit string entirely does away with the $2^{A-D}$ resistor strings between the D bit string nodes. However using a value of D greater than zero and less than A is preferred as providing a preferred combination of ease of trimming and desired performance.

Each of the nodes in the primary string have buffers that include a fast integrator and current sensing output stage that gives a wideband low impedance output to minimize the coupling between the lower order DACs during code switching. The offset of these buffers is the other large source of INL error. The buffers are designed with a low offset and drift input stage. In addition, as subsequently described in greater detail, a novel post-package trim scheme is integrated with these amplifiers that allows for package level trimming of the initial offset and temperature drift. Die-attach and point stresses caused by packages contribute to large shifts in offsets of active circuits. Hence, by trimming the buffers after packaging, extremely small levels of offsets are achieved, giving excellent INL performance. Since these “A” bits are the MSBs and common to all M DACs, they could be the largest contributor to nonlinearity of each “N” bit DAC. An additional advantage of common “A” MSBs is consistent INL performance over all the “M” channels.

The next “B” bits are independent for each DAC and are each implemented as a $2^B$ element resistor string (secondary ladder) that interpolates between any two adjacent primary (A bit) levels via a pair of CMOS transmission gates. FIG. 1 illustrates an interconnect circuit AB INT coupling a B resistor string of $2^B$ resistors to the A resistor string, and an interconnect circuit BC INT coupling a C resistor or tertiary string of $2^C$ resistors to the B resistor string, with an output select set of switches OUT SEL selecting the appropriate C resistor string node voltage as the DAC OUT output. The interconnect circuit AB INT, the B resistor string, the interconnect circuit BC INT and the output select switches OUT SEL are replicated for the rest of the M channels of the multiple channel DAC.

Figure 4:
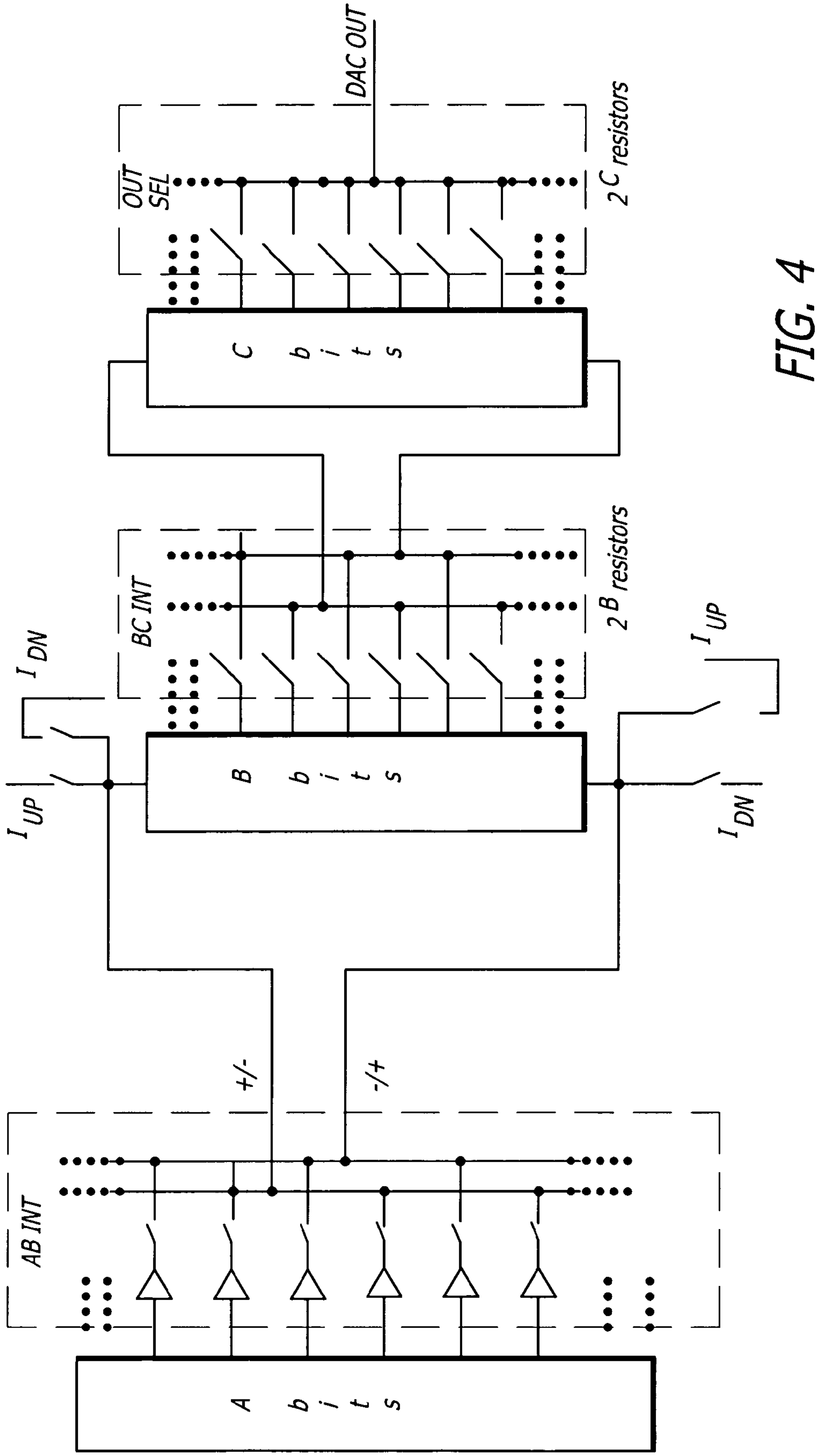
FIG. 4 is a diagram illustrating one channel of an M channel DAC, including interconnections for leapfrogging.

Leapfrogging (moving one end of the ladder at a time for each increment) is preferably, but not necessarily employed to transition between consecutive primary (A string) levels to reduce the number of CMOS transmission gates. Using leapfrogging, one end of each B resistor string need only be connectable to the odd numbered outputs of the A string (GND or first output, third, fifth, . . . , $V_{REF}$), and the other end connectable to the even numbered outputs of the A string (second, fourth, etc). This is illustrated in FIG. 4, wherein in the AB INT circuit, every other A string switch output is connected to one B string input. Thus, the number of CMOS switches needed (with leapfrogging) and for all M channels is:

$$\text{number of switches}=(2^A+1)*M \qquad \text{Equation 1}$$

This is to be compared with the number of switches needed if one end of each B resistor string had to be connectable to all nodes except $V_{REF}$ and the other end had to be connectable to all nodes of the B resistor string except GND, which would require (without leapfrogging):

$$\text{number of CMOS switches}=2^{(A+1)}*M \qquad \text{Equation 2}$$

Using leapfrogging, closing any two adjacent AB INT switches couples the voltage between each adjacent pair of A string outputs ($V_{REF}/2^A$) across the B bit resistor string. However, using leapfrogging, the A string output reverses polarity on each incremental change of the A string output (hence the +/− and −/+ indications in FIG. 4).

A pair of replica-biased current sources associated with each of the B resistor strings (M total) avoid current loading due to the secondary (B) string and effectively bootstraps the secondary string resistance. This current is switched into the secondary resistor string ends so that the primary buffers nominally do not need to provide any current. Without the replica-based bootstrap current, the voltage drop across the CMOS transmission gates (the switches in the AB INT circuit of FIGS. 1 and 4) and the metal track resistance would cause a positive DNL error at the primary code transitions.

Figure 3:
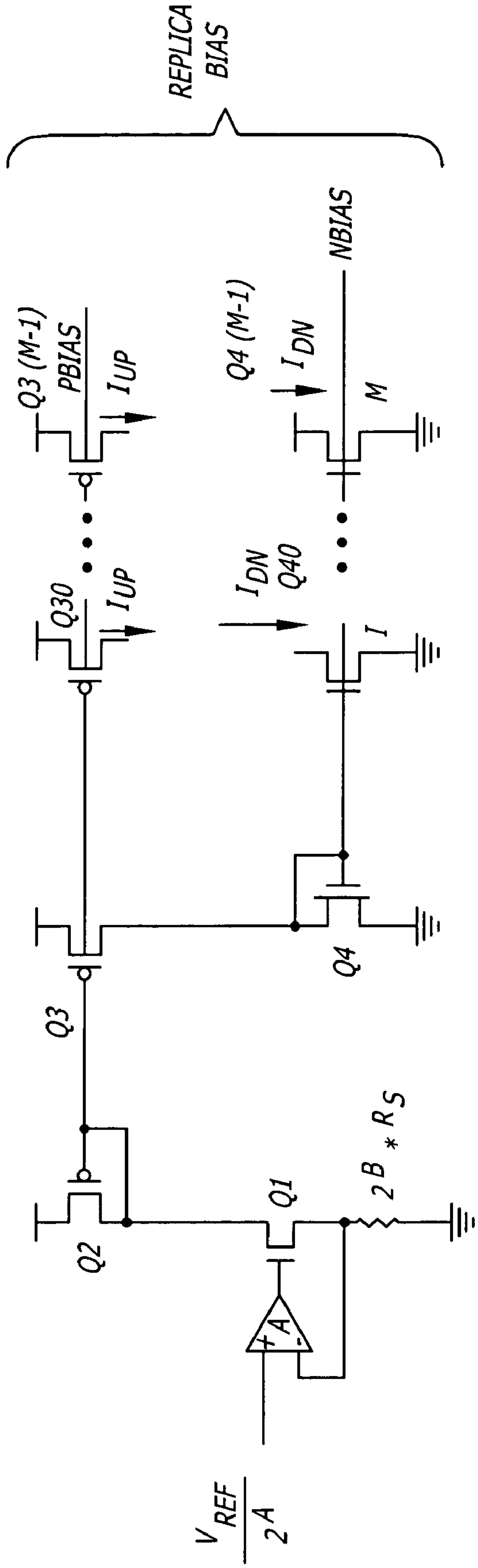
FIG. 3 presents an exemplary circuit for generating replica currents.

An exemplary circuit for generating the replica currents is shown in FIG. 3. The object of the circuit is to mirror equal positive ($I_{UP}$) and negative ($I_{DN}$) currents to each B resistor string, each of a magnitude to cause a nominal voltage drop across the resistor string equal to the voltage increment between adjacent primary string outputs. Thus the value of each bootstrap current is:

$$I_{UP}=I_{DN}=V_{REF}/2^A*2^B*R_S) \qquad \text{Equation 3}$$

where: $R_S$ is the unit resistor in the secondary ladder

Again, "M" pairs of replica-currents are needed to support the independent lower order DACs. In FIG. 3, amplifier A controls transistor Q1 so that the voltage across the resistor having a value equal to the total resistance of each B resistor string ($2^B*R_s$, where $R_s$ is the value of each resistor in each B string) is equal to the voltage between each adjacent pair of A string outputs ($V_{REF}/2^A$). That current is mirrored by transistor Q2 to M transistors Q30 through Q3(M−1) to provide the M positive currents $I_{up}$. That current is also mirrored by transistors Q3 and Q4 to M transistors Q40 through Q4(M−1) to provide the M negative currents $I_{DN}$. In one embodiment, these current sources incorporate resistor trimming for enhanced current matching.

As stated before, the use of leapfrogging causes the polarity of the A string output to reverse on each incremental change in the A string output. To accommodate this, the current sources $I_{UP}$ and $I_{DN}$ must be connected to each respective B string with the proper polarity for the then existing A string output. Thus, as shown in FIG. 4, switches are provided to couple either current sources $I_{UP}$ or $I_{DN}$ to each end of each B bit resistor string for this purpose (see the indication of bi-directional current sources $I_{UP}/I_{DN}$ and $I_{DN}/I_{UP}$ in FIG. 1).

The last "C" bits of each channel are implemented as a $2^C$ element resistor or tertiary string that interpolates between consecutive secondary string voltage levels. By choosing the resistance $R_s$ of individual resistors in the B bit resistor string and the resistance $R_T$ of individual resistors in the C bit resistor string such that $R_T>>R_S$, the loading error due to the tertiary or C bit ladder may be reduced. Since the last "C" bits form LSBs for the overall DAC, by properly choosing the ratio between $R_T$ and $R_s$, an acceptably small DNL error for the overall N bit DAC can be achieved. In a preferred embodiment, leapfrogging is used for the coupling of the C bit resistor string to the output of the B bit resistor string, again minimizing the number of switches needed in the BC INT circuit. However, while leapfrogging is used for both A string switching to the B strings and B string switching to the respective C string, leapfrogging may be used in one but not the other, or not used at all, as desired.

The LSB of the overall N bit DAC is given by:

$$LSB=V_{REF}/(2^{(A+B+C)}); \text{ where } N=A+B+C \qquad \text{Equation 4}$$

Figure 2:
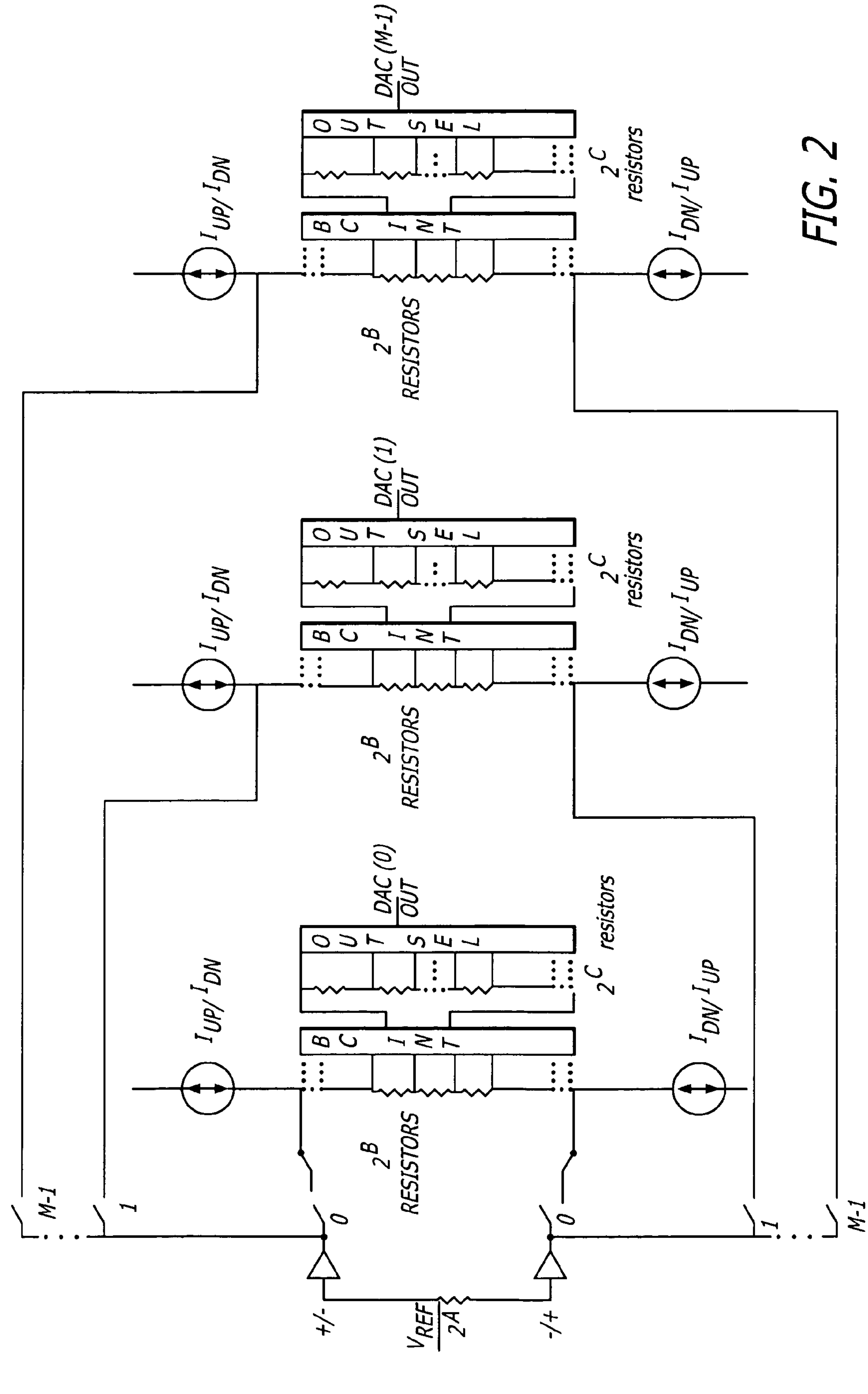
FIG. 2 is a diagram illustrating multiple channels (secondary or B resistor strings and tertiary or C resistor strings and associated circuitry) operative from the single primary or A resistor string.

In FIGS. 1 and 4, only one channel is specifically illustrated in order to allow the illustration of more detail for a representative channel. In FIG. 2, multiple channels (secondary or B resistor strings and tertiary or C resistor strings and associated circuitry) are illustrated. For each A resistor string buffered output, switches 0 through M−1 (FIG. 4) are provided in the AB INT circuitry (see FIG. 1) to allow the selective coupling of that A resistor string output increment ($V_{REF}$ $/2^A$), or to assist in the coupling of an adjacent increment, to a respective one of the B bit resistor strings for each of the M channels of the DAC.

With the segmented architecture of the present invention, one can achieve guaranteed monotonicity, and with the combination of circuit techniques and package level trimming, multi-channel high resolution DACs can be realized at low cost. In that regard, as mentioned before, a novel post-package trim scheme is integrated with these amplifiers that allows for package level trimming of the initial offset and temperature drift, in a preferred embodiment, using fuse trims. In particular, after packaging trim capabilities are provided by a serial interface coupled to on-chip digital-to-analog converters (DACs) associated with the buffers, which allow trimming of the initial offsets and temperature drift. Hence, extremely small levels of offsets are achieved, giving excellent INL performance.

While certain preferred embodiments of the present invention have been disclosed herein, such disclosure is only for purposes of understanding the exemplary embodiments and not by way of limitation of the invention. It will be obvious to those skilled in the art that various changes in form and detail may be made in the invention without departing from the spirit and scope of the invention as set out in the full scope of the following claims.

What is claimed is:

1. A multi-channel segmented resistor string digital to analog converter (DAC) comprising:

an A bit primary resistor string;

a plurality of buffer amplifiers, each buffering a respective node between resistors of the primary resistor string, outputs of the buffer amplifiers and ends of the primary resistor string defining $2^A+1$ primary string nodes;

a plurality M of B bit secondary resistor strings, the nodes between resistors and ends of each secondary resistor string defining $2^B+1$ secondary string nodes; and, a plurality of primary string switches coupled to each primary string node, an output of each switch being coupled to an end of a respective secondary resistor string.

2. The DAC of claim 1 wherein the offset voltage of the buffer amplifiers is minimized by trimming.

3. A multi-channel segmented resistor string digital to analog converter (DAC) comprising:

an A bit primary resistor string;

a plurality of buffer amplifiers, each buffering a respective node between resistors of the primary resistor string, outputs of the buffer amplifiers and ends of the primary resistor string defining $2^A+1$ primary string nodes;

a plurality M of B bit secondary resistor strings, the nodes between resistors and ends of each secondary resistor string defining $2^B$ +1 secondary string nodes;

a plurality of primary string switches coupled to each primary string node, an output of each switch being coupled to an end of a respective secondary resistor string;

a plurality M of C bit tertiary resistor strings, nodes between resistors and ends of the tertiary resistor strings defining $2^C+1$ tertiary string nodes for each tertiary resistor string;

a plurality of secondary string switches coupled to the nodes of the secondary strings, each switch being coupled to an end of a respective tertiary resistor string; and, output select switches coupled to the nodes of each tertiary resistor string controllable to select the voltage on any one node of each tertiary resistor string node as a DAC output for a total of M DAC outputs.

4. The DAC of claim 3 wherein the offset voltage of the buffer amplifiers is minimized by trimming.

5. The DAC of claim 3 further comprising M replica current sources, each coupled to a respective secondary resistor string, each replica current source providing a current through the respective secondary resistor string to cause a voltage across the respective secondary resistor string equal to the voltage between adjacent primary string nodes.

6. The DAC of claim 5 further comprising D bit resistor strings in parallel with the primary resistor string, where D is less than A, the D bit resistor strings being laser trimmed.

7. The DAC of claim 3 further comprising D bit resistor strings in parallel with the primary resistor string, where D is less than A, the D bit resistor strings being laser trimmed.

8. The DAC of claim 3 wherein the number of primary string switches coupled to each primary string node is M, outputs of the switches being coupled together in groups to the ends of respective secondary resistor strings to controllably couple the ends of each secondary resistor string to any pair of adjacent primary resistor string nodes using leapfrogging.

9. The DAC of claim 8 further comprising M replica current sources, each coupleable to a respective secondary resistor string with either polarity, each replica current source providing a current through the respective secondary resistor string to cause a voltage across the respective secondary resistor string of a magnitude and a polarity equal to the voltage between primary string nodes to which the respective secondary resistor string may be coupled.

10. The DAC of claim 3 wherein the resistance of each resistor in the tertiary string is greater than the resistance of each resistor in the secondary string.

11. The DAC of claim 10 wherein the number of secondary string switches coupled to each secondary string node is M, outputs of the secondary string switches being coupled together in groups to the ends of respective tertiary resistor strings to controllably couple the ends of each tertiary resistor string to any pair of adjacent secondary resistor string nodes using leapfrogging.

12. The DAC of claim 11 wherein the number of secondary string switches coupled to each secondary string node is M, outputs of the secondary string switches being coupled together in groups to the ends of respective tertiary resistor strings to controllably couple the ends of each tertiary resistor string to any pair of adjacent secondary resistor string nodes using leapfrogging.

13. The DAC of claim 3 wherein the multi-channel segmented resistor string digital to analog converter is a single integrated circuit.

14. A method of multiple channel digital to analog conversion comprising:

providing an A bit primary resistor string;

providing M secondary resistor strings and M tertiary resistor strings;

selectively coupling adjacent pairs of nodes in the primary string to opposite ends of each secondary resistor string, selectively coupling adjacent pairs of nodes in each secondary string to opposite ends of each tertiary resistor string; and, selectively coupling one node in each tertiary resistor string, each as one output of the multiple channel digital to analog conversion.

15. The method of claim 14 further comprising coupling a D bit resistor string in parallel with the A bit resistor string, where D is less than A, and laser trimming the D bit resistor string.

16. The method of claim 15 further comprised of coupling a current source in series with each secondary resistor string, each current source providing a current through the respective secondary resistor string equal to the voltage difference between adjacent nodes in the first resistor string.

17. The method of claim 16 wherein selectively coupling adjacent pairs of nodes in the primary string to opposite ends of each secondary resistor string is done using leapfrogging, and wherein the polarity of the current sources is varied accordingly.

18. The method of claim 17 wherein the resistance of each resistor in the tertiary resistor string is selected to be greater than the resistance of each resistor in the secondary resistor string.

19. The method of claim 18 further comprised of buffering the nodes between resistors in the primary resistor string.

20. The method of claim 19 further comprised of minimizing the offset voltage of the buffer amplifiers by trimming.

21. A multi-channel segmented resistor string digital to analog converter (DAC) comprising:

an A bit primary resistor string;

a plurality of buffer amplifiers, each buffering a respective node between resistors of the primary resistor string, outputs of the buffer amplifiers and ends of the primary resistor string defining $2^A+1$ primary string nodes;

a plurality M of B bit secondary resistor strings, the nodes between resistors and ends of each secondary resistor string defining $2^B+1$ secondary string nodes;

a plurality of primary string switches coupled to each primary string node, an output of each switch being coupled to an end of a respective secondary resistor string; and M replica current sources, each coupled to a respective secondary resistor string, each replica current source providing a current through the respective secondary resistor string to cause a voltage across the respective secondary resistor string equal to the voltage between adjacent primary string nodes.

22. A multi-channel segmented resistor string digital to analog converter (DAC) comprising:

an A bit primary resistor string, a plurality of buffer amplifiers, each buffering a respective node between resistors of the primary resistor string, outputs of the buffer amplifiers and ends of the primary resistor string defining $2^A+1$ primary string nodes;

a plurality M of B bit secondary resistor strings, the nodes between resistors and ends of each secondary resistor string defining $2^B+1$ secondary string nodes; and, a plurality of primary string switches coupled to each primary string node, an output of each switch being coupled to an end of a respective secondary resistor string;

wherein the number of primary string switches coupled to each primary string node is M, outputs of the switches being coupled together in groups to the ends of respective secondary resistor strings to controllably couple the ends of each secondary resistor string to any pair of adjacent primary resistor string nodes using leapfrogging.

23. The DAC of claim 22 further comprising M replica current sources, each coupleable to a respective secondary resistor string with either polarity, each replica current source providing a current through the respective secondary resistor string to cause a voltage across the respective secondary resistor string of a magnitude and a polarity equal to the voltage between primary string nodes to which the respective secondary resistor string may be coupled.

24. The DAC of claim 22 further comprised of:

M C bit tertiary resistor strings, nodes between resistors of each tertiary resistor string and ends of each tertiary resistor string defining $2^c+1$ tertiary string nodes; and, a plurality of secondary string switches, each coupled to a respective node of the secondary strings, each switch being coupled to an end of a respective tertiary resistor string.

25. The DAC of claim 24 wherein the resistance of each resistor in the tertiary string is greater than the resistance of each resistor in the secondary string.

26. The DAC of claim 24 further comprised of output select switches coupled to the nodes of each tertiary resistor string controllable to select the voltage on any one node of each tertiary resistor string node as a DAC output for a total of M DAC outputs.

27. The DAC of claim 24 wherein the number of secondary string switches coupled to each secondary string node is M, outputs of the secondary string switches being coupled together in groups to the ends of respective tertiary resistor strings to controllably couple the ends of each tertiary resistor string to any pair of adjacent secondary resistor string nodes using leapfrogging.

28. A multi-channel segmented resistor string digital to analog converter (DAC) comprising:

an A bit primary resistor string;

a plurality of buffer amplifiers, each buffering a respective node between resistors of the primary resistor string, outputs of the buffer amplifiers and ends of the primary resistor string defining $2^A+1$ primary string nodes;

a plurality M of B bit secondary resistor strings, the nodes between resistors and ends of each secondary resistor string defining $2^B$ +1 secondary string nodes;

a plurality of primary string switches coupled to each primary string node, an output of each switch being coupled to an end of a respective secondary resistor string;

M C bit tertiary resistors; and, a plurality of secondary string switches associated with the nodes of the secondary strings, each switch being coupled to an end of a respective secondary resistor string.

29. The DAC of claim 28 wherein the number of secondary string switches coupled to each secondary string node is M, outputs of the secondary string switches being coupled together in groups to the ends of respective tertiary resistor strings to controllably couple the ends of each tertiary resistor string to any pair of adjacent secondary resistor string nodes using leapfrogging.

30. A multi-channel segmented resistor string digital to analog converter (DAC) comprising:

an A bit primary resistor string;

a plurality of buffer amplifiers, each buffering a respective node between resistors of the primary resistor string, outputs of the buffer amplifiers and ends of the primary resistor string defining $2^A+1$ primary string nodes;

a plurality M of B bit secondary resistor strings, the nodes between resistors and ends of each secondary resistor string defining $2^B$ +1 secondary string nodes;

a plurality of primary string switches coupled to each primary string node, an output of each switch being coupled to an end of a respective secondary resistor string; and, D bit resistor strings in parallel with the primary resistor string, where D is less than A, the D bit resistor strings being laser trimmed.

* * * * *